US009176168B2

(12) United States Patent
Kinuta

(10) Patent No.: US 9,176,168 B2
(45) Date of Patent: Nov. 3, 2015

(54) PROBE CARD

(75) Inventor: Seichin Kinuta, Tochigi (JP)

(73) Assignee: Optnics Precision Co., Ltd, Tochigi (JP)

( * ) Notice: Subject to any disclaimer, the term of this patent is extended or adjusted under 35 U.S.C. 154(b) by 149 days.

(21) Appl. No.: 13/992,244

(22) PCT Filed: Dec. 15, 2011

(86) PCT No.: PCT/JP2011/079091
§ 371 (c)(1),
(2), (4) Date: Jun. 7, 2013

(87) PCT Pub. No.: WO2012/081677
PCT Pub. Date: Jun. 21, 2012

(65) Prior Publication Data
US 2013/0249585 A1    Sep. 26, 2013

(30) Foreign Application Priority Data
Dec. 17, 2010    (JP) ................................ 2010-282459

(51) Int. Cl.
*G01R 1/073*    (2006.01)
*G01R 1/067*    (2006.01)

(52) U.S. Cl.
CPC ........ *G01R 1/07357* (2013.01); *G01R 1/06722* (2013.01); *G01R 1/06755* (2013.01)

(58) Field of Classification Search
CPC ........... G01R 1/07378; G01R 31/2889; G01R 1/07342; G01R 1/06722
See application file for complete search history.

(56) References Cited

U.S. PATENT DOCUMENTS 4,666,573 A * 5/1987 DuBois et al. ................ 205/512
6,351,133 B1 * 2/2002 Jones et al. ............. 324/756.04

(Continued)

FOREIGN PATENT DOCUMENTS

CN        1494366         5/2004
JP        10-038920 A     2/1998

(Continued)

OTHER PUBLICATIONS

English language translation of the following: Office action dated Sep. 23, 2014 from the SIPO in a Chinese patent application corresponding to the instant patent application. This office action translation is submitted now in order to supplement the understanding of the cited references which are being disclosed in the instant Information Disclosure Statement.

*Primary Examiner* — Tung X Nguyen
(74) *Attorney, Agent, or Firm* — SOLARIS Intellectual Property Group, PLLC

(57) ABSTRACT

To provide a probe card that is used when carrying out electrical inspection of a high-density fine circuit board to be measured.
A probe card has plural probe pins, an insulator having plural through-holes through which the probe pins pass, and a pair of substrates that are positioned at both sides of the insulator and that have supporting holes into which end portions of the probe pins are inserted respectively. The pair of substrates and the insulator are provided so as to be slidable. One substrate is formed of a material having a same value as or an approximate value of a coefficient of thermal expansion of a fine circuit board to be measured, and another substrate is formed of a material having a same value as or an approximate value of a coefficient of thermal expansion of a wiring board for signal input/output.
By doing so, even if the fine circuit board to be measured and the wiring board for signal input/output thermally expand, the probe pins can always be made to contact the respective electrodes of the fine circuit board to be measured and the wiring board for signal input/output, and the probe pins that are adjacent do not short circuit. Therefore, electrical inspection of a high-density fine circuit board to be measured can be carried out at one time, and furthermore, precisely.

7 Claims, 4 Drawing Sheets

(56) References Cited

U.S. PATENT DOCUMENTS

| | | | |
|---|---|---|---|
| 7,367,813 B2 * | 5/2008 | Matsuo | 439/66 |
| 2004/0104739 A1 * | 6/2004 | Haga et al. | 324/757 |
| 2004/0157475 A1 | 8/2004 | Kazama et al. | |
| 2010/0141288 A1 * | 6/2010 | Di Lello | 324/755 |

FOREIGN PATENT DOCUMENTS

| | | |
|---|---|---|
| JP | 11-160356 A | 6/1999 |
| JP | 2002-340930 A | 11/2002 |
| JP | 4421550 B | 2/2010 |
| WO | 2010/098315 A1 | 9/2010 |

* cited by examiner

PROBE CARD

TECHNICAL FIELD

The present invention relates to a probe card that is used when carrying out electrical inspection of a fine circuit board to be measured, such as high-density multi-pin integrated circuit elements and high-density multi-pin integrated circuits and the like.

BACKGROUND ART

In recent years, at semiconductor integrated circuits, fine circuits, and fine circuits formed on organic substrates, the interval between the electrodes that are arrayed two-dimensionally has become extremely narrow due to advancements in the techniques of miniaturization. Patent Document 1 and Patent Document 2 are proposed as examples of methods for electrically measuring these integrated circuits.

PRIOR ART DOCUMENTS

Patent Documents

Patent Document 1: Japanese Patent No. 4421550
Patent Document 2: Japanese Patent Application Laid-Open No. 11-160356

SUMMARY OF INVENTION

Technical Problem

However, in order to ensure a sufficient amount of deflection at the probe shape proposed in Patent Document 1, the range occupied by one probe pin must be made to be large. Therefore, there is the problem that all of the circuits of the fine circuit board that is the object cannot collectively be measured electrically.

In order to overcome this problem, Patent Document 2 proposes, as a method of collectively measuring plural electrodes, a probe card that uses a combination of conductive rubber and a substrate at which numerous bump electrodes are formed by a lithographic technique on a ceramic multilayer substrate.

However, at a probe card that uses bump electrodes formed on a ceramic multilayer substrate, with the amount of deflection of the conductive rubber, it is difficult to obtain uniform contact over the entire surface of the wafer. Further, there is the problem that the conductivity also is low and reliable contact with the electrodes that are to be connected cannot be ensured.

Further, in a case in which a probe card, that uses a cantilevered probe and that is conventionally used in electrical inspection of semiconductors, has numerous probe pins due to the shape of the probe, the surface area of the probe card becomes large, and all semiconductor elements that are formed on a wafer cannot be measured collectively. Therefore, in order to carry out electrical inspection of numerous elements on a semiconductor wafer, measurement must be carried out by successively moving the probe card two-dimensionally, and there are the problems that a long inspection time is needed and continuous inspection while changing the test environment conditions cannot be carried out.

In particular, when the electrode interval of semiconductor elements is narrow at high-density multi-pin integrated circuit elements and high-density multi-pin integrated circuits and the like, due to thermal expansion of the semiconductor elements, the positions of the electrode terminals of the fine circuit board that is to be measured become offset from the probe pins, and the probe pins no longer contact the electrode terminals. Therefore, it is difficult to measure the electrical characteristics of the fine circuit board to be measured, while remaining connected to all of the terminals. Further, in order to dispose the probe pins in a two-dimensional form, there is the need to provide gaps or separating walls for ensuring insulation between the probe pins, while ensuring the elasticity of the probe pins. However, from the standpoint of structure, it is difficult to make the interval between the probes be less than or equal to 0.25 mm.

Therefore, either electrical inspection is carried out by causing a cantilevered probe to contact double or triple terminals at the four peripheral side portions of the semiconductor, or a method of successively measuring by moving the probe to the measurement place must be employed. Therefore, there are problems such as the burden on the inspection time, constraints on the matters to be inspected, difficulty in positioning at the time of probe assembly, constraints on the inspection environment, and the like.

Focusing on the above-described problems, an object of the present invention is to provide a probe card that, without probe pins short-circuiting one another and even if a fine circuit board to be measured and a wiring board for signal input/output thermally expand, causes the probe pins to simultaneously contact all of the electrode terminals of the fine circuit board to be measured and the wiring board for signal input/output respectively, and thereby, can precisely measure the electrical characteristics of the fine circuit board to be measured such as high-density multi-pin integrated circuit elements or high-density multi-pin integrated circuits and the like, and, in actual use, is extremely useful and is suited to ultra-high-density circuit elements in particular.

Solution to Problem

A probe card relating to a first aspect has: a plurality of probe pins that are elastic and that have one end portions that electrically contact electrodes of a fine circuit board to be measured, and other end portions that electrically contact electrodes of a wiring board for signal input/output; an insulator that has a plurality of through-holes through which the probe pins pass respectively; and one substrate and another substrate that are positioned at both sides of the insulator, the one substrate having supporting holes into which the one end portions of the probe pins are inserted, and the other substrate having supporting holes into which the other end portions of the probe pins are inserted, wherein the pair of substrates, that are formed from the one substrate and the other substrate, are provided so as to be able to slide with the insulator, the one substrate is formed of a material having a same value as or an approximate value of a coefficient of thermal expansion of the fine circuit board to be measured, and the other substrate is formed of a material having a same value as or an approximate value of a coefficient of thermal expansion of the wiring board for signal input/output.

In this way, there is made to be a three-layer structure that is formed from the insulator and the two substrates that are disposed at the both sides of this insulator, and these layers can slide together. The one substrate is formed of a material having the same value as or an approximate value of the coefficient of thermal expansion of the fine circuit board to be measured, and the other substrate is formed of a material having the same value as or an approximate value of the coefficient of thermal expansion of the wiring board for signal input/output. Due thereto, for example, when the positions of the fine circuit board to be measured and the wiring board for signal input/output change due to thermal expansion and the positions of the respective electrodes thereof become offset, the positions of the substrates facing them also move by the same amount of change due to equivalent thermal expansion, and the substrates slide with the insulator, and the probe pins follow along to the offset positions of the electrodes. Therefore, the probe pins always contact the respective electrodes of the fine circuit board to be measured and the wiring board for signal input/output, and furthermore, the probe pins are held within the through-holes of the insulator. Further, the probe pins do not short circuit one another.

In a probe card relating to a second aspect, the pair of substrates are formed of materials whose amounts of expansion/contraction, by which the substrates expand/contract accompanying a change in humidity, are the same.

Due thereto, even if the humidity of the environment in which electrical inspection is carried out changes, the pair of substrates expand/contract simultaneously and following the change in humidity of the fine circuit board to be measured and the wiring board for signal input/output. Therefore, the probe pins contacting the respective electrodes of the fine circuit board to be measured and the wiring board for signal input/output is maintained.

In a probe card relating to a third aspect, by forming the two substrate materials at the both sides of the insulator of a nonconductor that is any of silicon, silicon oxide, silicon carbide and sapphire, an appropriate material, that has the same value as or an approximate value of the coefficient of thermal expansion of the circuits of inorganic substrates that include semiconductors, is selected.

Note that, if the material of the fine circuit board to be measured and the material of the wiring board for signal input/output are different, the materials of these two substrates differ in accordance therewith.

In a probe card relating to a fourth aspect, by forming the two substrate materials at the both sides of the insulator of a nonconductor that is any of glass epoxy, polyimide, polypropylene, polyethylene or polytetrafluoroethylene, an appropriate material, that has the same value as or an approximate value of the coefficient of thermal expansion of the circuits of organic substrates that include semiconductors, and that has the same amount of expansion/contraction by which the material expands/contracts accompanying changes in humidity, is selected.

In this case as well, if the material of the fine circuit board to be measured and the material of the wiring board for signal input/output are different, the materials of these two substrates differ in accordance therewith.

In a probe card relating to a fifth aspect, by fabricating the probe pins of a binary alloy or a ternary alloy of palladium and by electroforming, probe pins that follow a sufficient amount of deflection and that have the needed elastic force are obtained.

Etching materials of such as phosphor bronze or beryllium copper, electroforming materials or the like such as Ni, NiCo or the like are used as conventional spring materials. However, when any of these are made into a minute spring shape, the resiliency deteriorates, and a sufficient resiliency, i.e., elastic force, cannot be sufficiently obtained. This phenomenon is particularly marked when measurement is carried out in an environment of a temperature of 80° C. to 130° C. Accordingly, the spring effect becomes problematic when the pitch of the probe pins is less than or equal to 250 µm. In contrast, in accordance with the binary or ternary alloy that is a palladium alloy in accordance with the present aspect, the elastic coefficient can be satisfied completely.

In a probe card relating to a sixth aspect, by directly irradiating X-rays onto polytetrafluoroethylene by using an X-ray mask, the insulator is formed in one step. Thereamong, polytetrafluoroethylene in particular is optimal because it is easy for the probe pins to slide.

In a probe card relating to a seventh aspect, the insulator is formed of an insulating polymer that is any of acryl, polycarbon, phenol, styrol, ABS, polypropylene, polyethylene, epoxy, silicon resin or silicon rubber, that is molded by using a mold prepared at a high aspect ratio by an X-ray exposure process and electroforming. The insulator is formed highly accurately in plural steps.

Advantageous Effects of Invention

As described above, in accordance with the probe card relating to the first aspect of the present invention, there is made to be a three-layer structure that is formed from the insulator and the two substrates at the both sides thereof, and these layers can slide together. The one substrate is formed of a material having the same value as or an approximate value of the coefficient of thermal expansion of the fine circuit board to be measured, and the other substrate is formed of a material having the same value as or an approximate value of the coefficient of thermal expansion of the wiring board for signal input/output. Therefore, even if the pitch interval of the electrodes of the fine circuit board to be measured is 30 µm to 200 µm which is narrow, and the fine circuit board to be measured and the wiring board for signal input/output thermally expand, the probe pins can always be made to contact the respective electrodes of the fine circuit board to be measured and the wiring board for signal input/output, and probe pins that are adjacent do not short circuit. Therefore, there can be obtained the excellent effect that electrical inspection of a fine circuit board to be measured, such as high-density multi-pin integrated circuit elements and high-density multi-pin integrated circuits and the like, can be carried out at one time, and moreover, precisely.

In accordance with the probe card relating to the second aspect, even if the humidity of the environment in which electrical inspection is carried out changes, the pair of substrates expand/contract simultaneously and following the change in humidity of the fine circuit board to be measured and the wiring board for signal input/output. Due thereto, the probe pins always contact the respective electrodes of the fine circuit board to be measured and the wiring board for signal input/output. Therefore, the excellent effect that electrical inspection can be carried out precisely can be obtained.

In accordance with the probe card relating to the third aspect, there can be obtained the excellent effect that the materials of the pair of substrates can be selected from among nonconductors that are any of silicon, silicon oxide, silicon carbide, or sapphire that have the same values as or approximate values of the respective coefficients of thermal expansion of the fine circuit board to be measured and the wiring board for signal input/output.

In accordance with the probe card relating to the fourth aspect, there can be obtained the excellent effect that the materials of the pair of substrates can be selected from among nonconductors that are any of glass epoxy, polyimide, polypropylene, polyethylene, or polytetrafluoroethylene, that have the same values as or approximate values of the respective coefficients of thermal expansion of the fine circuit board to be measured and the wiring board for signal input/output, and whose amounts of expansion/contraction, by which the materials expand/contract accompanying a change in humidity, are the same.

In accordance with the probe card relating to the fifth aspect, there can be obtained the excellent effect that a high elastic coefficient, good durability, and a stable electrical resistance value can be maintained, while the probe pins have a length of 0.5 to 4.5 mm and are superfine at a thickness of 5 to 25 μm square.

In accordance with the probe card relating to the sixth aspect, there can be obtained that excellent effects that, by directly irradiating X-rays onto polytetrafluoroethylene by using an X-ray mask, the insulator that has holes in a high aspect ratio can be formed in one step, and, by selecting polytetrafluoroethylene that has a good sliding characteristic in particular, the probe pins can be expanded/contracted smoothly.

In accordance with the probe card relating to the seventh aspect, the excellent effect can be obtained that an insulator having holes in a high aspect ratio can be prepared inexpensively because the insulator is formed by fabricating a high-aspect mold by an X-ray exposure process and electroforming, and by carrying out injection molding, as compared with a conventional insulator that is fabricated by layering many layers of insulating silicon hole-structuring plates by forming by layering numerous substrates that are formed by etching expensive silicon.

DESCRIPTION OF EMBODIMENTS

A probe card 7 relating to an embodiment of the present invention is described hereinafter on the basis of FIG. 1 through FIG. 5. However, the present invention is not limited in any way to the following embodiment.

Figure 1:
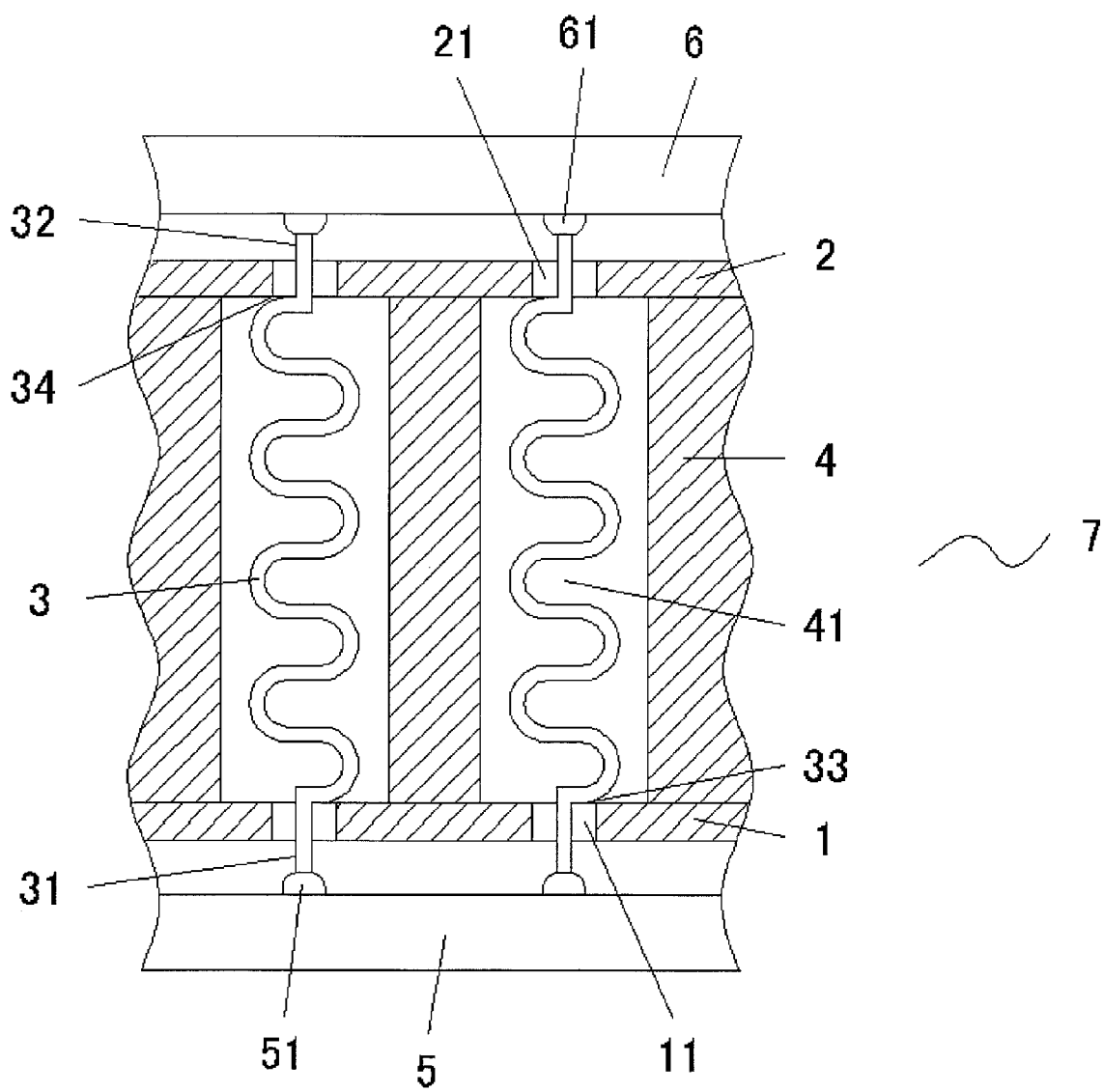
FIG. 1 is a cross-sectional view of a probe card illustrating an embodiment of the present invention.
Figure 2:
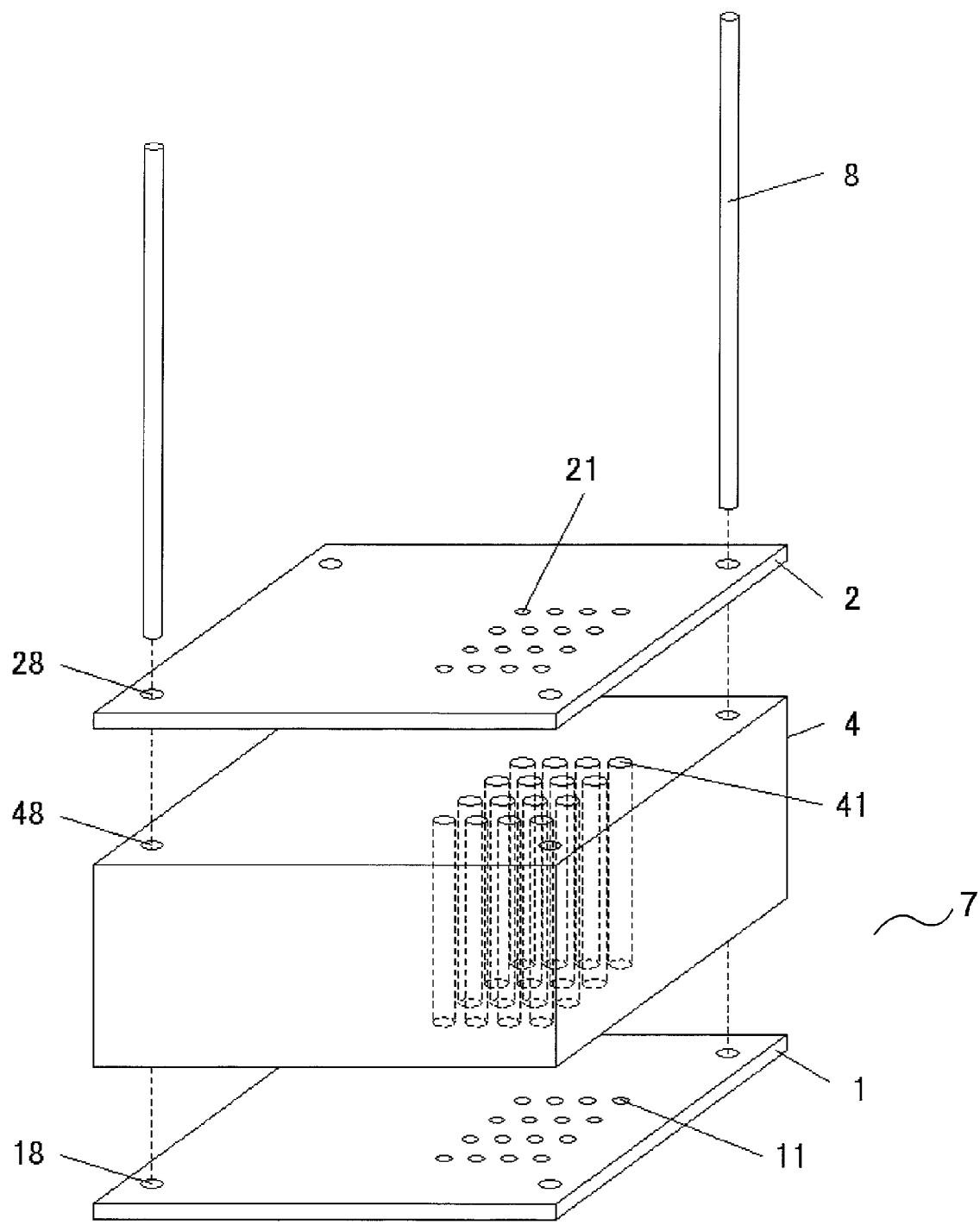
FIG. 2 is an exploded perspective view of the probe card illustrating the embodiment of the present invention.

In FIG. 1 and FIG. 2, 1 is one substrate and 2 is another substrate. Supporting holes 11, through which one end portions 31 of plural probe pins 3 penetrate, are provided in the one substrate 1, and supporting holes 21, through which other end portions 32 of the plural probe pins 3 penetrate, are provided in the other substrate 2.

4 is an insulator and is disposed between the pair of substrates 1, 2. Plural through-holes 41, through which the plural probe pins 3 respectively pass, are provided in the insulator 4. The inner diameters of these through-holes 41 are set to be larger than those of the supporting holes 11, 12 as will be described later.

In this way, a three-layer structure is formed by the insulator 4 and the pair of substrates 1, 2 that are positioned at the both sides thereof. Although not illustrated in FIG. 1, the one substrate 1 and the other substrate 2 are joined to the insulator 4 with slight gaps therebetween, so as to be able to slide with the insulator 4.

5 is a fine circuit board to be measured. The one substrate 1 is formed of a material having the same value as or an approximate value of the coefficient of thermal expansion of this fine circuit board to be measured 5.

6 is a wiring board for signal input/output. The other substrate 2 is formed of a material having the same value as or an approximate value of the coefficient of thermal expansion of the wiring board for signal input/output 6.

If the fine circuit board to be measured 5 and the wiring board for signal input/output 6 are non-organic materials, nonconductors such as silicon, silicon oxide, silicon carbide, or sapphire are used as the materials thereof.

If the fine circuit board to be measured 5 and the wiring board for signal input/output 6 are organic materials, nonconductors such as glass epoxy, polyimide, polypropylene, polyethylene, or polytetrafluoroethylene, whose amount of expansion/contraction when expanding/contracting accompanying changes in humidity is the same, are used as the materials thereof.

Note that an approximate value of the coefficient of thermal expansion is a numerical value of the coefficient of thermal expansion that is premised on the distance, that the positions of the supporting holes 11 become offset due to changes in temperature, being less than or equal to the minimum pitch of electrodes 51 of the fine circuit board to be measured 5, and similarly, the distance, that the positions of the supporting holes 12 become offset due to changes in temperature, being less than or equal to one-half of the minimum pitch of electrodes 61 of the wiring board for signal input/output 6.

In this way, the substrate 1 and the substrate 2 do not have to be the same materials. If the substrate 1 is formed of a material having the same coefficient of thermal expansion as the material of the fine circuit board to be measured 5 and the substrate 2 is formed of a material having the same coefficient of thermal expansion as the material of the wiring board for signal input/output 6 as described above, it is expedient because contact of the fine circuit board to be measured 5 and the wiring board for signal input/output 6 with the probe pins 3 can be guaranteed even if, for example, the coefficients of thermal expansion of the substrate 1 and the substrate 2 are different.

Figure 3:
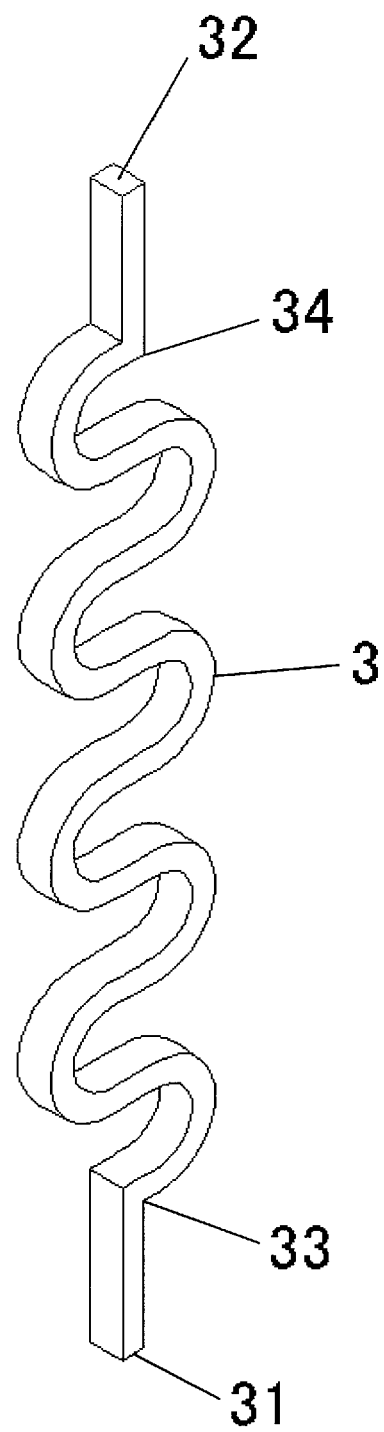
FIG. 3 is a perspective view of a probe pin illustrating the embodiment of the present invention.
Figure 4:
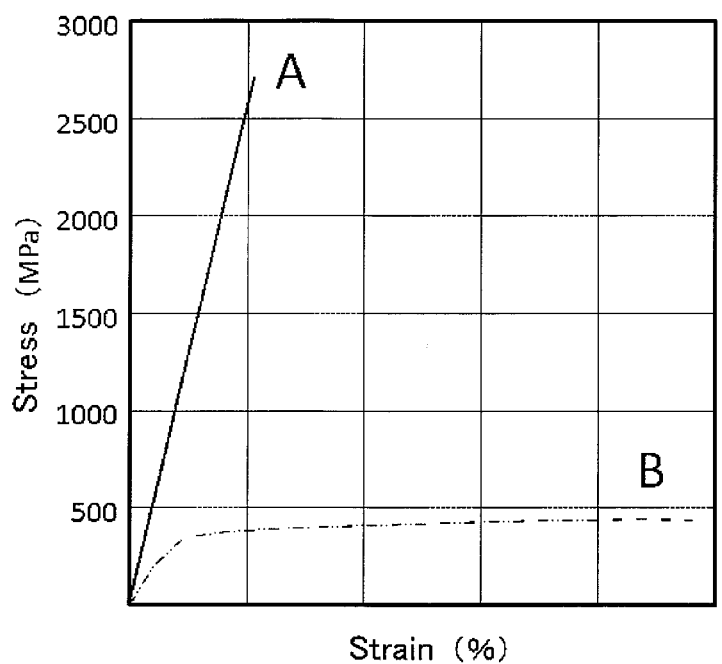
FIG. 4 is a graph showing proof strength of the probe pin illustrating the embodiment of the present invention.

As shown in FIG. 3, the probe pins 3 are formed of a palladium alloy that is formed by electroforming, and FIG. 4 is a graph showing the results of measurement of the proof strength (elastic limit stress) of the probe pin 3. In FIG. 4, the horizontal axis is strain (%) and the vertical axis is stress (MPa), and A illustrates a case in which an alloy of 60% palladium and 40% nickel is used as the alloy of the probe pin 3, and B illustrates a case in which an alloy of 80% nickel and 20% cobalt is used as a conventional alloy. It could be confirmed that the proof strength of A in accordance with the present invention is 2,700 MPa, which is much larger than the 500 MPa of B.

Figure 5:
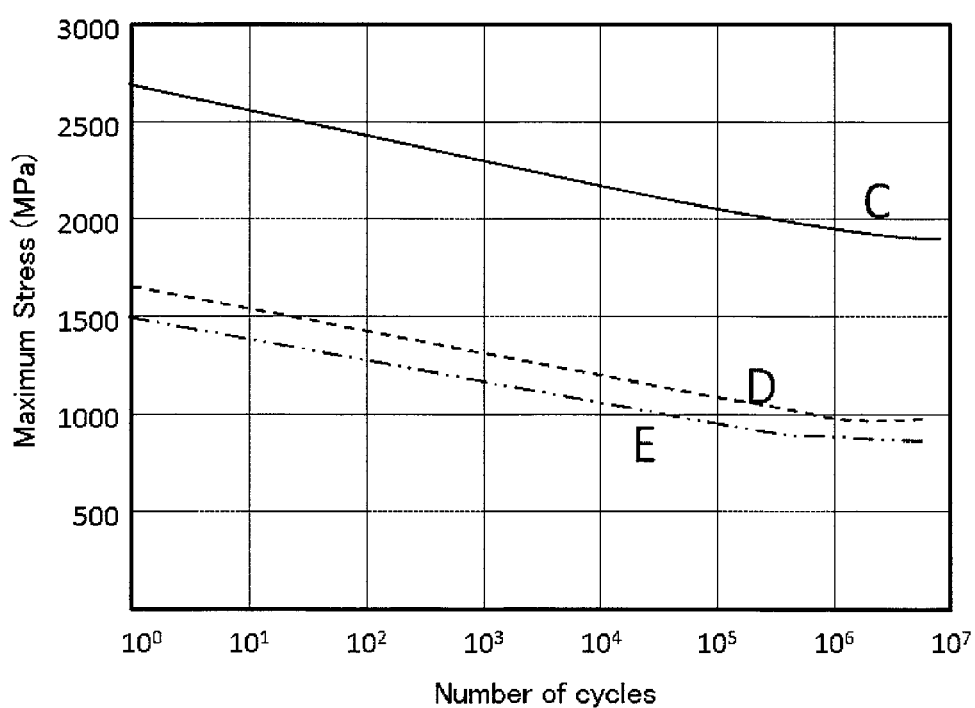
FIG. 5 is a graph showing fatigue strength of the probe pin illustrating the embodiment of the present invention.

Further, FIG. 5 is a graph showing the results of measurement of fatigue strength, and the horizontal axis is the number of repetitions (cycles) and the vertical axis is the maximum stress (MPa). In FIG. 5, C is in accordance with the present invention and illustrates a case of using an alloy of 60% palladium and 40% nickel as the alloy of the probe pin 3, and D and E are conventional materials, and D illustrates a case in which a nickel/cobalt alloy is used, and E illustrates a case in which nickel is used. When the maximum stress is 1000 MPa, D breaks at the point in time of 700,000 cycles and E breaks at the point in time of 50,000 cycles, whereas C in accordance with the present invention does not break even if there are 10,000,000 cycles. Therefore, it could be confirmed that the proof strength is greater than or equal to two times to 14 times that of the conventional nickel/cobalt alloy material and nickel material.

Note that it could be confirmed that there is high proof strength and fatigue strength, that are similar to those of the above-described alloy of 60% palladium and 40% nickel, even when either of an alloy of 80% palladium and 20% cobalt, or an alloy of 60% palladium and 20% nickel and 20% cobalt, is used as another palladium alloy.

Further, the probe pin 3 is a square bar of a length of 2.0 mm and a thickness of 3×3 μm to 10×25 μm, and is formed in a wave shape whose maximum width of the wave-shaped width is 30 to 150 μm and at which the number of bent portions for ensuring an amount of deflection is two or more. When the thickness of the square bar is 10×25 μm, it has the characteristic that the spring deformation amount at a load of 10 grams is 100 μm.

This load pressure is a high pressure that conventional probe pins, that are made of general spring materials, phosphor bronze, phosphorous-containing copper and the like, cannot withstand at all. An ultra-high elasticity that can withstand such high pressure is ensured at the probe pin 3, and the fatigue strength of the probe pin 3 as well is around several times to several tens of times higher than that of a conventional probe pin. This contributes to increasing the lifespan of the probe card 7.

The probe pin 3 is supported due to wave-shaped both end portions 33, 34 abutting and being stopped at the supporting holes 11, 21 of the one substrate 1 and the other substrate 2, respectively. For the supporting hole 11, a square or round hole of 4 μm to 40 μm is provided at the same position as the electrode 51 such that the one end portion 31 of the probe pin 3 electrically contacts the electrode 51 of the fine circuit board to be measured 5. For the supporting hole 12, a square or round hole of 4 μm to 40 μm is provided such that the other end portion 32 of the probe pin 3 electrically contacts the electrode 61 of the wiring board for signal input/output 6.

The insulator 4 is either formed by directly irradiating X-rays onto polytetrafluoroethylene by using an X-ray mask, or is formed of an insulating polymer that is molded by using a mold prepared by an X-ray exposure process and electroforming. The insulator 4 has a thickness of 1.0 mm to 5.0 mm.

The hole dimension of the through-hole 41 is 30 μm to 180 μm, and the hole dimensions of a square hole are 5×5 μm to 120×120 μm. By passing the plural probe pins 3 through the plural through-holes 41 respectively, the probe pins 3 contacting one another is prevented and short-circuiting is prevented, and the postures of the probe pins 3 are ensured. Note that the number of the through-holes 41 and the supporting holes 11, 21 are arbitrary, For example, at a semiconductor element of 32 pins×32 pins, the number of holes is 1024, and, at a semiconductor element of 64 pins×64 pins, the number of holes is 4096.

(Operation)

The present embodiment is structured as described above, and the operation thereof is described hereinafter. First, the probe pins 3 are inserted into the through-holes 41. Thereafter, in the state in which the one end portions 31 of the probe pins 3 are passed-through the supporting holes 11 of the one substrate 1, and the other end portions 32 of the probe pins 3 are passed-through the supporting holes 21 of the other substrate 2, and the wave-shaped both end portions 33, 34 abut the supporting holes 11, 21, the insulator 4 and the one substrate 1 and the other substrate 2 are joined, and the probe card 7 is thereby completed.

When using the probe card 7, the one end portions 31 of the probe pins 3 are made to electrically contact the electrodes 51 of the fine circuit board to be measured 5, and the other end portions 32 of the probe pins 3 are made to electrically contact the electrodes 61 of the wiring board for signal input/output 6. Due thereto, electrical inspection of the fine circuit board to be measured 5, such as high-density multi-pin integrated circuit elements and high-density multi-pin integrated circuits and the like, can be carried out.

In this case, because the probe pins 3 are held within the through-holes 41 of the insulator 4, even if the interval between the electrodes 51 of the fine circuit board to be measured 5 is 50 μm to 200 μm which is narrow, the probe pins 3 do not contact one another and therefore do not short circuit. Furthermore, because the probe pins 3 are formed of a palladium alloy and by electroforming and the surfaces thereof are subjected to nickel plating and gold plating, a high elastic coefficient, good durability, and a stable electrical resistance value can be maintained.

Moreover, if the fine circuit board to be measured 5 swells due to thermal expansion and the positions of the electrodes 51 become offset, the position of the one substrate 1 also changes due to equivalent thermal expansion, and the probe pins 3 follow along to the offset positions of the electrodes 51. Therefore, the probe pins 3 can be positioned in conformance with the electrodes 51 of the fine circuit board to be measured 5. Thus, the probe pins 3 can be made to always contact the electrodes 51 of the fine circuit board to be measured 5.

Similarly, if the wiring board for signal input/output 6 swells due to thermal expansion and the positions of the electrodes 61 become offset, the position of the other substrate 2 also changes due to equivalent thermal expansion, and the probe pins 3 follow along to the offset positions of the electrodes 61. Therefore, the probe pins 3 can be positioned in conformance with the electrodes 61 of the wiring board for signal input/output 6. Accordingly, the probe pins 3 can be made to always contact the wiring board for signal input/output 6.

By doing so, electrical inspection of the fine circuit board to be measured 5, such as high-density multi-pin integrated circuit elements and high-density multi-pin integrated circuits and the like, can be carried out at one time, and moreover, precisely.

Further, even if the humidity of the environment in which the electrical inspection is carried out changes, the pair of substrates 1, 2 follow along the changes in humidity of the fine circuit board to be measured 5 and the wiring board for signal input/output 6 and expand/contract simultaneously, and the probe pins 3 contact the electrodes 51, 61 of the fine circuit board to be measured 5 and the wiring board for signal input/output 6, respectively. Therefore, the electrical inspection can be carried out precisely.

EXAMPLES

Shapes of the probe pins 3 are formed on a conductor substrate by an X-ray exposure process or a photolithographic process, and the conductor substrate is immersed in an alloy plating liquid of palladium/nickel or palladium/nickel/cobalt. By electroforming, electricity is supplied for 50 minutes until there becomes a width of 10 μm and a thickness of 20 μm, and the probe pins 3 are formed on the conductor substrate.

Then, when the probe pins 3 are removed from the conductor substrate that has reached the prescribed thickness, the probe pins 3 can be used as probe pins for a probe card.

Assembly of the probe card 7 is described. First, the substrate 1, at which 1024 of the supporting holes 11 having a hole dimension of 12×27 μm are formed in a silicon substrate of a thickness of 0.2 mm, and the substrate 2, at which 1024 of the supporting holes 12 having a hole dimension of 12×27 μm are formed in a silicon substrate of a thickness of 0.2 mm, are prepared. Further, the insulator 4, that has a thickness of 2.0 mm and in which 1024 of the supporting holes 41, that are square holes of 40×40 μm at a 50 pitch, are provided, is readied. Then, the through-holes 41 of the insulator 4 and the supporting holes 11 of the substrate 1 are made to coincide, and the insulator 4 and the substrate 1 are slidingly joined, and thereafter, the probe pins 3 are dropped into the through-holes 41 from above the through-holes 41, and the one end portions 31 are made to penetrate through into the supporting holes 11. Thereafter, the other end portions 32 are made to penetrate through from the supporting holes 21 of the substrate 1. When fixing tools 8 are inserted through fixing holes 18, 28, 48 of the substrate 1 and the substrate 2 and the insulator 4 respectively so as to join them together with a gap such that the substrate 2 can slide with the insulator 4, assembly of the probe card 7 is completed.

Industrial Applicability

Generally, in order to ensure quality with respect to thermal load and to confirm reliability in the fabricating process of fine circuit boards to be measured, a bare chip is placed in a burn-in device, and after being left there under set thermal conditions, the bare chip is removed from the burn-in device, and electrical evaluation of the fine circuit boards to be measured that are on a wafer is carried out individually by a probe card that uses cantilevered probes.

This is because a probe card that carries out electrical evaluation cannot be made to be compact due to the shape of the probe pins, and, of necessity, electrical evaluation must be carried out with the bare chip removed from the burn-in device.

On the other hand, by using the probe card 7 of the present invention, the wafer-shaped fine circuit board to be measured 5 can be placed in a burn-in device while contacting the probe card 7, and, reliable measurement with respect to thermal load, that continues at times of raising the temperature of the heating load and at times of constant heating and at times of cooling, is possible. Further, even if the humidity of the measurement environment varies, precise measurement is possible, and the reliability, in the marketplace, of the fine circuit board to be measured can be guaranteed to be even better.

Further, heating load and electrical evaluation can be carried out simultaneously, and, in the process of fabricating the fine circuit board to be measured, shortening of the fabrication time is devised and an improvement in mass produceability can be attained.

DESCRIPTION OF THE REFERENCE NUMERALS 1 one substrate 2 other substrate 3 probe pin 4 insulator 5 fine circuit board to be measured 6 wiring board for signal input/output 7 probe card

The invention claimed is:

1. A probe card comprising:

a plurality of probe pins that are elastic and that have first end portions that electrically contact electrodes of a fine circuit board to be measured, and second end portions that electrically contact electrodes of a wiring board for signal input/output;

an insulator that has a plurality of through-holes through which the probe pins pass respectively; and a first substrate and a second substrate that are respectively positioned at both sides of the insulator, the first substrate having supporting holes into which the first end portions of the probe pins are inserted, and the second substrate having supporting holes into which the second end portions of the probe pins are inserted, wherein the first substrate and the second substrate are provided so as to be able to slide with the insulator, the first substrate is formed of a material having a same value as or an approximate value of a coefficient of thermal expansion of the fine circuit board to be measured, and the second substrate is formed of a material having a same value as or an approximate value of a coefficient of thermal expansion of the wiring board for signal input/output, and wherein each of the plurality of probe pins includes first and second wave-shaped end portions, and each of the plurality of probe pins is supported due to the first and second wave-shaped end portions abutting and being stopped at the supporting holes of the first substrate and the second substrate, respectively.

2. The probe card of claim 1, wherein the first and second substrates are formed of materials whose amounts of expansion/contraction, by which the substrates expand/contract accompanying a change in humidity, are the same.

3. The probe card of claim 1, wherein the first and second substrates are formed of a nonconductor that is any of silicon, silicon oxide, silicon carbide, or sapphire.

4. The probe card of claim 1, wherein the first and second substrates are formed of a nonconductor that is any of glass epoxy, polyimide, polypropylene, polyethylene, or polytetrafluoroethylene.

5. The probe card of claim 1, wherein the probe pins are fabricated of a binary alloy or a ternary alloy of palladium, by electroforming.

6. The probe card of claim 1, wherein the insulator is formed by directly irradiating X-rays onto polytetrafluoroethylene by using an X-ray mask.

7. The probe card of claim 1, wherein the insulator is formed of an insulating polymer that is any of acryl, polycarbon, phenol, styrol, ABS, polypropylene, polyethylene, epoxy, silicon resin or silicon rubber, and that is molded by using a mold prepared by an X-ray exposure process and electroforming.

* * * * *